United States Patent [19]

Bassous et al.

[11] Patent Number: 5,340,753
[45] Date of Patent: Aug. 23, 1994

[54] METHOD FOR FABRICATING SELF-ALIGNED EPITAXIAL BASE TRANSISTOR

[75] Inventors: Ernest Bassous, Bronx; Gary L. Patton, Poughkeepsie; Johannes M. C. Stork, Yorktown Heights, all of N.Y.

[73] Assignee: International Business Machines Corp., Armonk, N.Y.

[21] Appl. No.: 47,094

[22] Filed: Apr. 14, 1993

Related U.S. Application Data

[62] Division of Ser. No. 606,658, Oct. 31, 1990, abandoned.

[51] Int. Cl.$^5$ .......................................... H01L 21/265
[52] U.S. Cl. ............................... 437/31; 437/7; 437/162; 437/909; 148/DIG. 11; 148/DIG. 124
[58] Field of Search ................ 437/31, 7, 162, 909; 148/DIG.10, DIG. 11, DIG. 124

[56] References Cited

U.S. PATENT DOCUMENTS

| | | | |
|---|---|---|---|
| 3,929,528 | 12/1975 | Davidson et al. | 148/174 |
| 4,338,622 | 7/1982 | Feth et la. | 357/92 |
| 4,381,953 | 5/1983 | Ho et al. | 148/1.5 |
| 4,534,806 | 8/1985 | Magdo | 148/1.5 |
| 4,641,416 | 2/1987 | Iranmanesh et al. | 29/576 W |
| 4,703,554 | 11/1987 | Havemann | 437/31 |
| 4,733,287 | 3/1988 | Bower | 357/34 |
| 4,892,837 | 1/1990 | Kudo | 437/31 |
| 5,006,912 | 4/1991 | Smith et al. | 357/34 |
| 5,008,207 | 4/1991 | Blouse et al. | 437/31 |
| 5,132,765 | 7/1992 | Blouse et al. | 357/34 |

FOREIGN PATENT DOCUMENTS

63-289863 11/1988 Japan ........................... 357/34

OTHER PUBLICATIONS

Kuhn, G. L., et al., "Thin Silicon Film on Insulating Substrate," *Journal of the Electrochemical Society*, vol. 120, No. 11, pp. 1563–1566 (1973).

Burghartz, J. N., et al., "Self–Aligned SiGe–Base Heterojunction Bipolar Transistor By Selective Epitaxy Emitter Window (SEEW) Technology," *IEEE Electron Device Letters*, vol. 11, No. 7, pp. 288–290 (Jul. 1990).

*Primary Examiner*—Tom Thomas
*Assistant Examiner*—Tuan Nguyen
*Attorney, Agent, or Firm*—Scully, Scott, Murphy & Presser

[57] ABSTRACT

The present invention is directed to a method for forming a self-aligned epitaxial base transistor in a double polysilicon type process using non-selective low temperature epitaxy (LTE) to form the base layer. The present invention utilizes a thin very heavily doped LTE layer that is both a conductive etch stop and a diffusion source for doping the extrinsic base of the transistor. The deposition of the non-selective LTE base layer is followed immediately by the deposition of the conductive etch stop layer. A layer of undoped polycrystalline semiconductor is deposited on the conductive etch stop layer and subsequently ion implanted. Oxide and nitride insulating layers are deposited and the structure is patterned using a highly directional reactive ion etch to form the emitter window leaving a thin layer of the polycrystalline layer. The thin polycrystalline layer is selectively removed in a KOH solution leaving the conductive etch stop layer. The portion of the etch stop layer exposed in the emitter window is selectively removed by oxidation. Thereafter, conventional double polysilicon processing techniques are continued to form the insulator sidewalls and the emitter region in the window. During an annealing drive-in step, the conductive etch stop layer acts as an additional dopant source to the extrinsic base. The etch stop layer provides a conductive contact between the instrinsic base and the extrinsic base of the transistor.

17 Claims, 3 Drawing Sheets

METHOD FOR FABRICATING SELF-ALIGNED EPITAXIAL BASE TRANSISTOR

This is a divisional of copending application Ser. No. 606,658, filed on Oct. 31, 1990, now abandoned.

FIELD OF THE INVENTION

The present invention relates to the fabrication of very small integrated bipolar transistors using double polysilicon deposition technology and more particularly, to self-aligned epitaxial base transistors formed by low temperature epitaxy.

BACKGROUND OF THE INVENTION

The present trend in semiconductor technology is toward very large scale integration of devices with high speed and low power dissipation. To achieve this, it is essential that the devices be made as small as possible by making the vertical junction structure shallower and reducing horizontal geometry. Precise shallow junction profiles can be achieved with ion implantation of dopant species and their subsequent annealing with a thermal cycle. Device horizontal geometry depends to a large extent on the lithographic tools available. U.S. Pat. No. 3,929,528 to Davidson et al. discloses a conventional non-self-aligned process which uses various selective etching and deposition techniques to define device regions. Davidson et al. is directed to the use of a P+ etch stop layer for providing sufficiently planar surface for further processing. Davidson et al. indicate, however, that a P+ etch stop layer will result in undesirable effects due to out diffusion during annealing and seek to solve this problem by completely removing the layer by polishing or etching prior to the anneal.

Within a given lithographic straint, the use of a self-aligned process can greatly improve device performance. The use of a self-aligned polysilicon base is a powerful technique in that it allows self registration of the emitter implant to the polysilicon base contact and allows the base contact to be moved from the device base area onto the polysilicon thus reducing the device base area. Examples of prior art patents describing the conventional self-aligned extrinsic base regions for forming high performance bipolar transistors are: U.S. Pat. Nos. 4,381,953; 4,338,662; 4,641,416; and 4,703,554.

A further trend in semiconductor technology is the use of low temperature epitaxy (LTE), typically performed in an ultra high vacuum chemical vapor deposition (UHV/CVD) process. The use of LTE is very advantageous in that it permits the deposition of epitaxial layers at low temperatures which allows shallow base profiles to be maintained and permits the deposition of compound semiconductor layers such as SiGe that are impossible with ion implantation.

Several different types of self-aligned base processes have been developed. One type is the single polysilicon process in which the extrinsic base is formed of polysilicon and the emitter is implanted. A second is the double polysilicon layer process in which both the extrinsic base and the emitter are formed from polysilicon. Both processes have their advantages and disadvantages and the selection of the process will depend on subsequent end-use of the transistor being formed.

In the fabrication of bipolar transistors, it would be advantageous to use the LTE process in fabricating a double polysilicon self-aligned device. However, attempts to use LTE in double polysilicon technology have resulted in problems because the deposition is not selective, making it difficult to fabricate self-aligned devices. In the formation of an epitaxial base bipolar transistor, if the LTE base layer deposition takes place after the formation of the extrinsic base stack, several approaches have been investigated including the base after sidewall approach and the high pressure oxidation (HIPOX) removal method. However, these methods are not suitable for the new trend towards forming heterojunction bipolar transistors, such as SiGe base transistors, because the success of these two methods depends strongly on specific diffusion and oxidation steps. The deposition of the LTE base layer before the extrinsic base stack was heretofore impossible because of its lack of an intrinsic base etch stop when patterning the polysilicon stack. Thus, there is a need for a method for forming an LTE base transistor using the double polysilicon self-aligned process technology with a minimum of changes that is suitable for both homojunction and heterojunction base transistors.

SUMMARY OF THE INVENTION

The present invention is directed to a method for forming a self-aligned epitaxial base transistor in a double polysilicon type process using low temperature epitaxy to form the base layer. The present invention utilizes a thin very heavily doped LTE layer that is both a conductive etch stop and a diffusion source for doping the extrinsic base of the transistor. The very thin heavily doped LTE layer acts as an etch stop in the formation of the emitter window. The conductive etch stop layer need only be selectively removed in the ember window, because the remaining portion is a conducting layer for contacting the intrinsic base to the extrinsic base.

The method of the present invention involves depositing by LTE a base layer of doped semiconductor on a semiconductor substrate followed immediately by a LTE deposition of a very thin, very heavily doped layer of semiconductor forming the conducting etch stop layer. A layer of undoped polycrystalline semiconductor is deposited on the conductive etch stop layer and subsequently ion implanted. One or more layers of insulating material are deposited and the structure is patterned using a highly directional reactive ion etch (RIE) to form the emitter window. The RIE etch is a timed etch that is stopped before reaching the etch stop layer thus leaving a thin layer of the undoped polycrystalline layer. The remaining portion of the undoped polycrystalline layer exposed in the emitter window is selectively removed in a potassium hydroxide (KOH) solution. The heavy doping of the etch stop layer effectively prevents the layer from being etched because the etch rate of heavily doped material is much smaller than undoped semiconductor. The exposed portion of the conductive etch stop layer in the emitter window is then selectively oxidized to effectively remove the layer. The oxidation is selective because the oxidation rate of heavily doped semiconductor is much faster than the non-heavily doped base layer. Thereafter, conventional double polysilicon processing techniques are continued to form insulator sidewalls and the emitter region in the emitter window. The structure is then subjected to an annealing step, during which the thin heavily doped layer acts as an additional dopant source to the extrinsic base and remains a conductive contact between the intrinsic base and the extrinsic base of the transistor.

DETAILED DESCRIPTION OF THE PRESENT INVENTION

Figure 1:
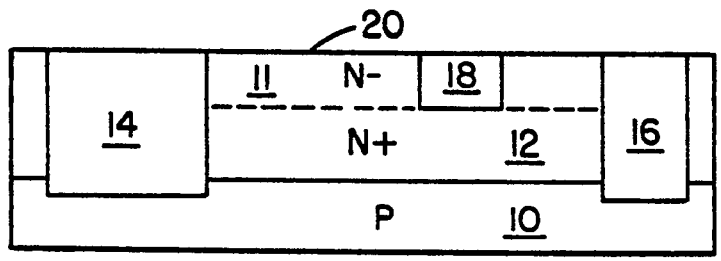
FIGS. 1–10 are cross-sectional views disclosing the fabrication of the transistor of the present invention at successive stages in accordance with the process of the present invention.

In accordance with the present invention, a self-aligned epitaxial base transistor is formed using double polycrystalline semiconductor process technology. Referring to the drawings, FIGS. 1–10 will be described in connection with the various steps of fabrication of the self-aligned epitaxial base transistor of the present invention. While the process will be described in connection with forming an NPN transistor, it should be understood that the features of the present invention may be adapted for forming a PNP transistor. It should also be understood that various conventional processes relating to applying, exposing and developing photoresist materials to form desired patterns for masking layers are not specifically described herein but are well known in the art. Moreover, the invention contemplates the use of recent advances in epitaxial deposition techniques such as low temperature epitaxy (ILTE) and low pressure chemical vapor deposition (LPCVD) that are known and are also not specifically described herein except to indicate that LTE refers to an epitaxy process performed in the range of temperatures between 500° to 700° C. with a preferred range being 550°–650° C. In addition, the invention is described with silicon being used as a semiconductor material, however, any other suitable semiconductor material may be utilized. Furthermore, reference will be made to conventional double polysilicon processing technology such as that described in U.S. Pat. No. 4,381,953, assigned to the same assignee as the present invention and incorporated herein by reference. In addition, the various thicknesses of the layers will be described in the formation of an illustrative embodiment of the invention, but it should be understood that the thicknesses are relative and will be dependent upon the application for the transistors being formed by the present method.

Referring now to FIG. 1, there is shown a P-type substrate 10 of monocrystalline silicon which is heavily doped N-type for forming the subcollector region 12. The impurity can be any suitable N-type impurity, as for example, arsenic, and can be introduced into the substrate by any suitable technique, as for example, diffusion or ion implantation. A layer of lightly doped N-typed silicon is deposited on the layer 12 for forming collector region 11. Conventional well known processing techniques are used to form deep trench isolation regions 14 and 16 and shallow trench isolation region 18. The deep trench isolation regions are used to isolate the device being formed from other devices on the wafer while the shallow isolation region is used to separate the collector reach-through region from the base region of the transistor. The structure shown in FIG. 1, having a substantially planar surface 20, is the starting point for the method of the present invention.

Figure 2:
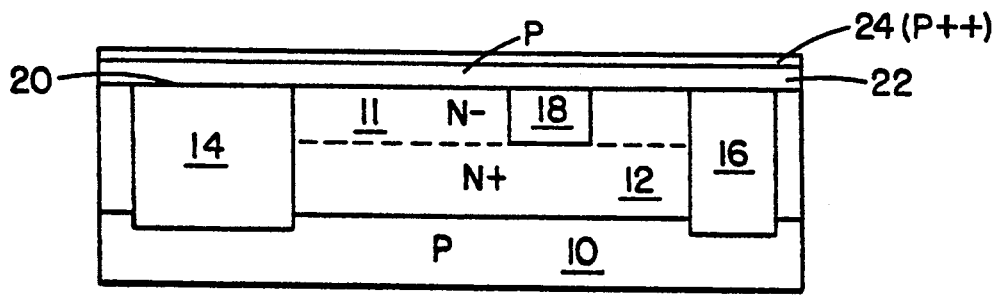

As shown in FIG. 2, a base layer 22 of silicon is epitaxially deposited on surface 20 by UHV/CVD. As is well known, monocrystalline silicon will form on the silicon region 12 and polycrystalline silicon will form on the isolation regions. Base layer 22 is in situ doped P-type, typically in the range of $10^{17}$–$10^{19}$ cm$^{-3}$. Layer 22 is deposited using a low temperature epitaxy (LTE) process. The deposition of layer 22 is immediately followed by the deposition by LTE of a very thin heavily doped (p++) layer of polysilicon 24. Layer 24 is typically doped to a carrier concentration of $10^{21}$ cm$^{-3}$ or greater. Layer 22 may be in the range of 50 nm thick and layer 24 may be deposited in the range of 10 to 20 nm thick. The deposition of layers 22 and 24 may be performed in a single deposition process in which the dopant level is abruptly increased after the desired thickness for layer 22 is reached.

Figure 3:
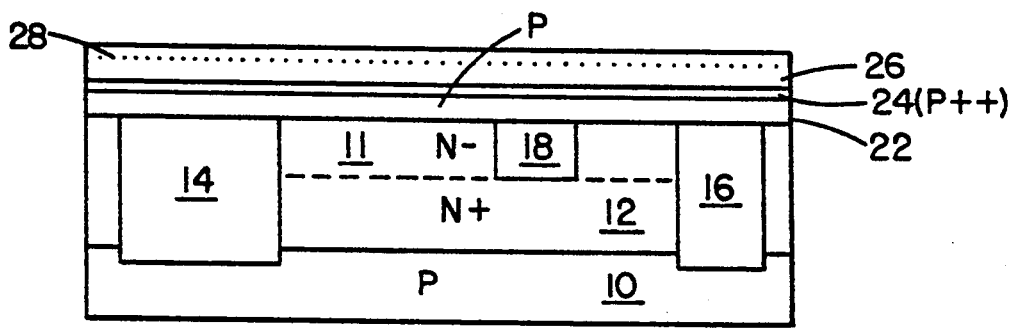

As shown in FIG. 3, a layer of undoped polysilicon 26 is epitaxially deposited typically by LPCVD. Layer 26 has a thickness typically in the range of about 180 nm. Layer 26 is ion implanted with boron using known implantation techniques. The boron implant is indicated at 28.

Figure 4:
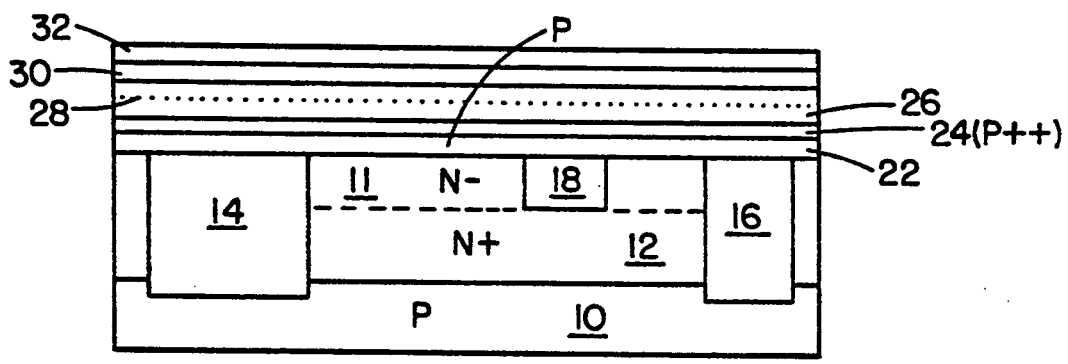

Next, one or more layers of insulating material is deposited on layer 26. As shown in FIG. 4, typically a first layer of oxide 30 is deposited on layer 28 followed by a layer 32 of nitride. Layers 30 and 32 may be deposited by any well known wet or dry deposition process. Layer 30 may typically be in the range of 100 nm thick and layer 32 may typically be in the range of 80 nm thick.

Figure 5:
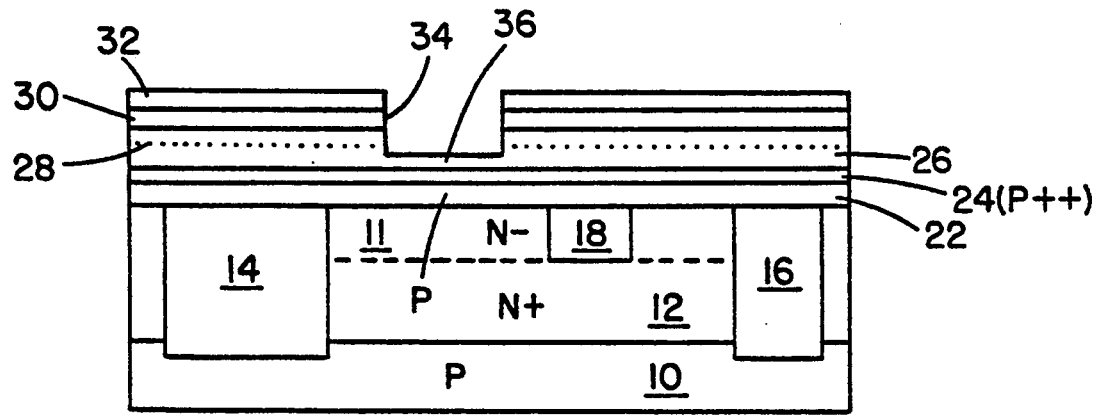

Thereafter, the wafer is patterned and etched typically by using a highly directional reactive ion etch (RIE) to form emitter window 34 as shown in FIG. 5. The base layer 22 must not be etched during this step and therefore, the etch is timed so that the depth of the etch into layer 26 will be several 10's of nanometers above layer 24. This remaining portion 36 of layer 26 provides an etch stop tolerance so that in the worst case a portion of layer 24 will be etched but layer 22 will not be etched.

Figure 6:
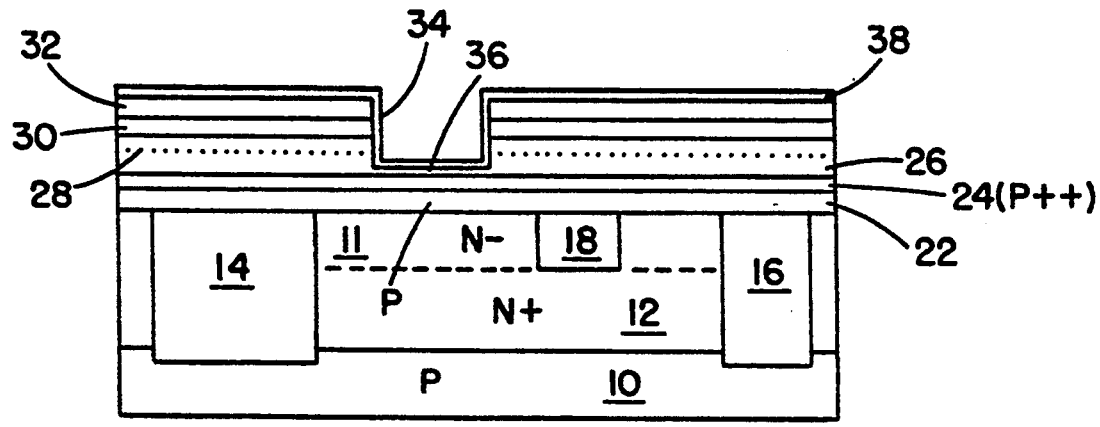

FIG. 6 shows an optional step in which a very thin nitride layer 38 is subsequently deposited on layer 32 and the sidewalls and bottom wall of emitter window 34. The thin nitride layer 38 acts to preserve the integrity of the sidewalls of the emitter window during further processing of the transistor. The thickness of the nitride layer 38 may be anywhere in the range from 5 to 100 nm. As stated, this step is optional and would be necessary only where extreme accuracy is necessary because of a particular transistor application.

Figure 7:
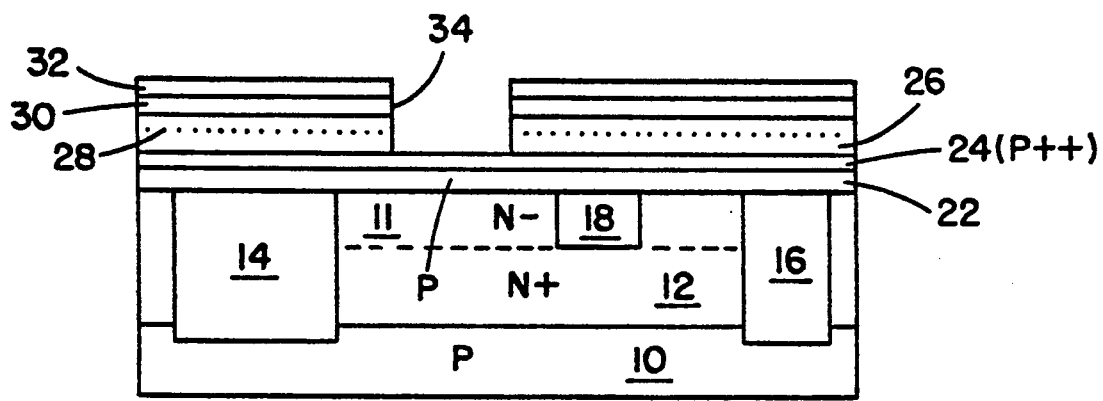

Turning now to FIG. 7, after the emitter window is formed, the etch stop tolerance region 36 of layer 26 is selectively removed in a potassium hydroxide (KOH) solution etch. The KOH etch makes use of the etch selectivity of layer 24 in that because the etch rate of undoped polysilicon is much greater than heavily doped silicon, the layer 24 will effectively not be etched by the KOH solution.

Figure 8:
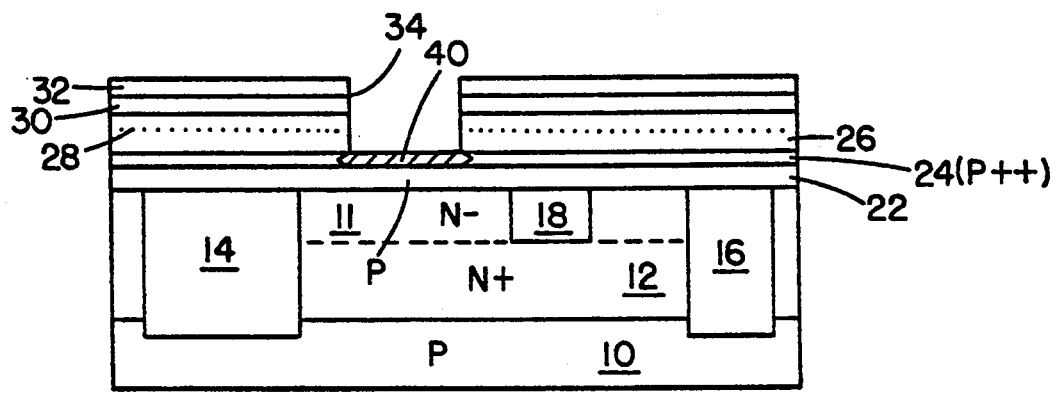
Figure 9:
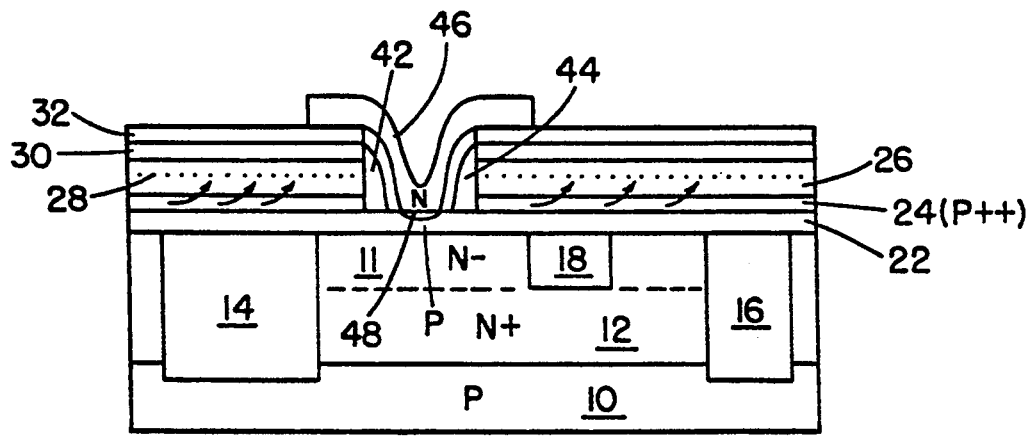

In the next step in accordance with the method of the present invention, the portion 40 as shown in FIG. 8, of layer 24 immediately below the emitter window 34 is in effect selectively removed by oxidizing that portion by thermal oxidation. The portion can be selectively oxidized due to the enhanced oxidation rate of the heavily doped layer. The heavily doped layer 24 oxidizes about 10 times faster than the lesser doped silicon layer 22. The effective removal of layer 24 below the emitter window 34 by oxidation results in the layer 24 remaining below the layer 26. Layer 26 will form the extrinsic base of the transistor and as will be described further hereinbelow, the remaining portion of layer 24 acts as a conductive contact between the extrinsic base and the intrinsic base of the transistor and also as additional dopant source for the extrinsic base. A portion of the P-type dopant will also diffuse into layer 26 during the thermal oxidation step.

At this point, conventional double polysilicon processing techniques are used to form oxide sidewall 42 and nitride sidewall 44 and to deposit the emitter region 46 of N-doped polysilicon. As stated previously, well known photolithographic masking and etching steps are used to form the sidewalls and emitter region and need not be described here. The wafer is then subjected to a thermal cycle to out diffuse the emitter region 48 into a portion of base layer 22, and to drive in the boron implant 28 into layer 26 and the arsenic into the emitter region. During this thermal cycle, the P++ dopant in layer 24 is also driven into layer 26 and thereby serves as an additonal P+ source.

Figure 10:
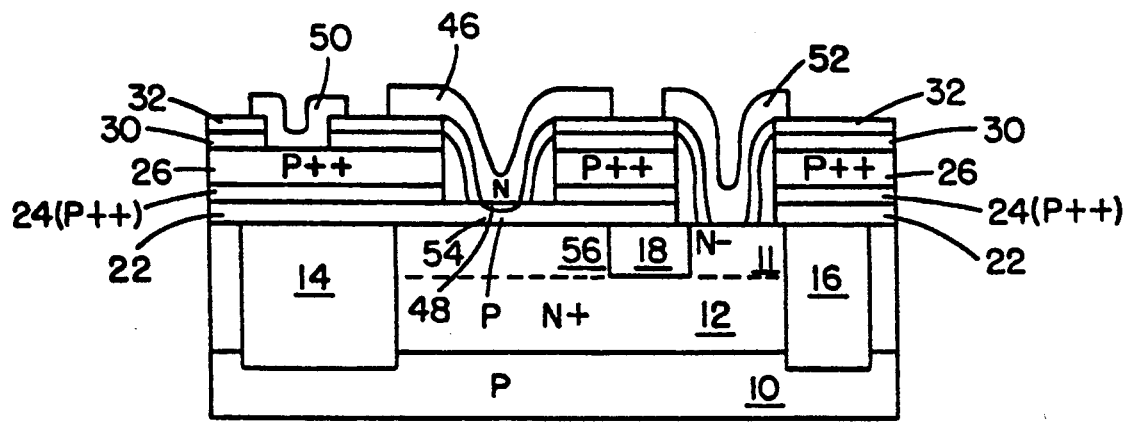

As shown in FIG. 10, thereafter, conventional photolithographic masking and etching steps are utilized to form metallic contact 50 to the base 54, and metal contact 52 to the collector 56. Thus, an NPN transistor is formed having a self-aligned epitaxial base 26, and an intrinsic base 54 sandwiched between emitter 48 and collector 56. Layer 24 acts as a conductive contact between the intrinsic base 54 and extrinsic base 26.

In forming the transistor shown in FIG. 10, it should be understood that sufficient boron doping must be provided at the edge of the shallow isolation region 18. The deposition of the non-selective epitaxial base layer 22 before formation of the extrinsic base stack provides good doping at the corners of the isolation region to eliminate any potential leakage path. Essentially no overlay is required for the emitter opening because of the good link provided by the heavily doped layer 24 between the extrinsic base 26 and intrinsic base 54. The total active device area can therefore be limited to the minimum emitter window dimension plus the worst case overlay. Because of the combination of the use of the double polysilicon process and the non-selective LTE base, the worst case overlay, which is the horizontal spacing between the inner edge of the emitter opening sidewall and the inner edge of the isolation region, can be as low as 0.2 microns. The emitter opening can continue to be smaller than the minimum dimension by the width of the sidewall.

In summary, the present invention provides a conductive etch stop using two unique properties of very heavily doped LTE, namely, etch selectivity in KOH solutions, and enhanced oxidation rate at very low temperatures. The present invention results in the fabrication of minimum size, self-aligned double polysilicon transistors. In addition, the present invention is well suited for the formation of heterojunction bipolar transistors utilizing a compound semiconductor of silicon germanium (SiGe) as a base layer 22. This is possible because of the early deposition by LTE of the non-selective epitaxial base layer, which is suitable for the deposition of SiGe. The collector layer 12 is silicon and the emitter region 46 is polysilicon thereby forming a heterojunction bipolar transistor.

While the invention has been particularly shown and described with respect to preferred embodiments thereof, it will be understood by those skilled in the art that the foregoing and other changes in form and details may be made therein without departing from the spirit and scope of the invention, which should be limited only by the scope of the appended claims.

Having thus described the invention, what is claimed as new and what is desired to be secured by Letters Patent is:

1. A method for forming a self-aligned epitaxial base transistor comprising the steps of:
    (a) depositing an intrinsic base layer of epitaxial semiconductor on a substrate structure having shallow and deep trench isolation regions defining a collector region doped with a first conductivity type, said intrinsic base layer being doped with a second conductivity type;
    (b) depositing a conductive etch stop layer of heavily doped epitaxial semiconductor on said intrinsic base layer, said conductive etch stop layer having a thickness substantially thinner than said intrinsic base layer and being heavily doped with said second conductivity type;
    (c) depositing an extrinsic base layer of undoped polycrystalline semiconductor on said conductive etch stop layer, and implanting a dopant of said second conductivity type in an upper surface of said extrinsic base layer;
    (d) depositing an oxide layer on said extrinsic base layer;
    (e) depositing a nitride layer on said oxide layer;
    (f) forming an emitter window vertically through said nitride and oxide layers and a portion of said extrinsic base layer;
    (g) selectively removing the remaining portion of said extrinsic base layer within said emitter window;
    (h) selectively oxidizing said conductive etch stop layer within said emitter window;
    (i) forming oxide and nitride sidewalls within said emitter window; and
    (j) forming an emitter region of polycrystalline semiconductor within said emitter window, said emitter region being doped with said first conductivity type; and,
    (k) driving dopant of said second conductivity type from said heavily doped conductive etch stop layer into said undoped extrinsic base layer and from said upper surface of said extrinsic base layer into said undoped extrinsic base layer.

2. The method of claim 1 further including the step of depositing a nitride sidewall layer in said emitter window prior to the selective removal of the remaining portion of the extrinsic base layer within said emitter window.

3. The method of claim 1 wherein said intrinsic base layer, said conducting etch stop layer and said extrinsic base layer are each formed of silicon.

4. The method of claim 1 wherein the intrinsic base layer is formed of a compound semiconductor, and, said conducting etch stop layer and said extrinsic base layer are formed of silicon.

5. The method of claim 4 wherein the compound semiconductor is silicon germanium.

6. The method of claim 1 wherein the intrinsic base layer is deposited by low temperature epitaxy.

7. The method of claim 6 wherein the low temperature epitaxy is performed using an ultra high vacuum chemical vapor deposition process.

8. The method of claim 1 wherein the conductive etch stop layer is deposited by low temperature epitaxy.

9. The method of claim 8 wherein the low temperature epitaxy is performed using an ultra high vacuum chemical vapor deposition process.

10. The method of claim 1 wherein said conductive etch stop layer is deposited to a thickness in the range of 10 to 20 nm.

11. The method of claim 1 wherein the extrinsic base layer is deposited by low pressure chemical vapor deposition.

12. The method of claim 11 wherein the extrinsic base layer is ion implanted with the dopant of the second conductivity type.

13. The method of claim 1 wherein the intrinsic base layer and the conductive etch stop layer are deposited in a single deposition process in which the dopant concentration of said intrinsic base layer is abruptly increased from a range of about $10^{17}$–$10^{19}$ cm$^{-3}$ to a concentration of about $10^{21}$ cm$^{-3}$ to form said conductive etch stop layer.

14. The method of claim 1 wherein the emitter window is formed by a reactive ion etch.

15. The method of claim 14 wherein the reactive ion etch is a highly directional timed etch.

16. The method of claim 1 wherein the remaining portion of said extrinsic base layer is selectively removed in a KOH solution.

17. The method of claim 1 wherein the step of forming said emitter region further includes the step of annealing, said conductive etch stop layer being a dopant source for said extrinsic base layer during said annealing.

* * * * *